US008680670B2

(12) United States Patent
Casey et al.

(10) Patent No.: US 8,680,670 B2
(45) Date of Patent: Mar. 25, 2014

(54) MULTI-CHIP MODULE SYSTEM WITH REMOVABLE SOCKETED MODULES

(75) Inventors: Jon Alfred Casey, Poughkeepsie, NY (US); John Lee Colbert, Byron, MN (US); Paul Marian Harvey, Austin, TX (US); Mark Kenneth Hoffmeyer, Rochester, MN (US); Charles L Reynolds, Red Hook, NY (US)

(73) Assignee: International Business Machines Corporation, Armonk, NY (US)

( * ) Notice: Subject to any disclaimer, the term of this patent is extended or adjusted under 35 U.S.C. 154(b) by 449 days.

(21) Appl. No.: 12/909,980

(22) Filed: Oct. 22, 2010

(65) Prior Publication Data

US 2012/0098116 A1    Apr. 26, 2012

(51) Int. Cl.
*H01L 23/10* (2006.01)

(52) U.S. Cl.
USPC .......................................................... 257/706

(58) Field of Classification Search
USPC .................. 257/532, 536, 700, 774, E23.003, 257/E23.004, E23.005, E23.007, E21.503, 257/E21.511; 438/109, 455, 459
See application file for complete search history.

(56) References Cited

U.S. PATENT DOCUMENTS

| 5,137,836 | A | 8/1992 | Lam |
| 5,198,963 | A | 3/1993 | Gupta |
| 5,297,006 | A | 3/1994 | Mizukoshi |
| 5,321,277 | A | 6/1994 | Sparks |
| 5,396,032 | A | 3/1995 | Bonham |
| 5,492,235 | A | 2/1996 | Crafts |
| 5,548,884 | A | 8/1996 | Kim |
| 5,734,555 | A | 3/1998 | McMahon |
| 5,784,264 | A | 7/1998 | Tanioka |
| 5,920,464 | A | 7/1999 | Yokoyama |
| 6,024,581 | A | 2/2000 | Barnett |
| 6,385,044 | B1 * | 5/2002 | Colbert et al. ................. 361/700 |
| 6,634,095 | B2 * | 10/2003 | Colbert et al. .................. 29/740 |
| 6,734,539 | B2 | 5/2004 | Degani |
| 6,757,965 | B2 | 7/2004 | Colbert |
| 6,809,269 | B2 | 10/2004 | Fuller |
| 7,095,614 | B2 * | 8/2006 | Goldmann ..................... 361/704 |
| 2003/0000080 | A1 * | 1/2003 | Colbert et al. .................. 29/832 |
| 2004/0088121 | A1 * | 5/2004 | Colbert et al. .................. 702/43 |

(Continued)

OTHER PUBLICATIONS

Pan—"Critical Variables of Solder Paste Stencil Printing for Micro-BGA and Fine-Pitch QFP", IEEE Transactions on Electronics Packaging Manufacturing, vol. 27, No. 2 (Apr. 2004).

(Continued)

*Primary Examiner* — Julio J Maldonado
*Assistant Examiner* — Moin Rahman
(74) *Attorney, Agent, or Firm* — David Mims; Mark P Kahler (57) ABSTRACT

A multi-chip module (MCM) includes chip sub-modules that are fabricated as self-contained testable entities. The chip sub-modules plug into respective sockets in a frame of the MCM. Each chip sub-module may be tested before being plugged into the MCM. A chip sub-module may include an IC chip, such as a processor, mounted to an sub-module organic substrate that provides interconnects to the chip. The frame into which each chip sub-module plugs sits on a mini-card organic substrate that interconnects the chip sub-modules together. The MCM may include a downstop between the mini-card organic substrate and a system board to limit or prevent solder creep of solder connections between the mini-card organic substrate and the system board.

16 Claims, 5 Drawing Sheets

(56) References Cited

U.S. PATENT DOCUMENTS

2004/0113245 A1    6/2004  Takaoka
2007/0232090 A1*  10/2007  Colgan et al. .................. 439/66
2009/0134511 A1*  5/2009  Shah ............................. 257/723

OTHER PUBLICATIONS

Speedline—"Stencil and Screen Printing: Frequently Asked Questions", Speedline Technologies (Nov. 2003).

* cited by examiner

FIG. 5

MULTI-CHIP MODULE SYSTEM WITH REMOVABLE SOCKETED MODULES

BACKGROUND

The disclosures herein relate generally to integrated circuits, and more specifically, to combining multiple integrated circuit chips in a multi-chip module.

Multi-chip modules (MCMs) combine several integrated circuit chips or dies in a common assembly. MCMs may offer significant advantages in system performance. For example, MCMs may consolidate many high performance chips in a small form factor with shorter interconnects that run at higher speeds than standard monolithic single chip modules (SCMs). MCMs offer higher interconnect density and greater bandwidth than typical single chip modules (SCMs) and printed circuit boards will allow. MCMs may also facilitate more cost-effective thermal management by consolidating thermal dissipation requirements in a single location and then employing a highly efficient cooling solution such as a cold plate and/or water cooling that may not be economically feasible with SCMs dispersed on a system motherboard or system planar.

BRIEF SUMMARY

In one embodiment, a multi-chip module (MCM is disclosed that includes a plurality of chip sub-modules, each chip sub-module including a respective integrated circuit (IC) chip situated on a first organic substrate that includes interconnects coupled to the IC chip, each chip sub-module being configured as a separately testable entity. The MCM further includes an MCM frame including a plurality of sockets, each socket removably receiving a respective chip sub-module of the plurality of chip sub-modules. One embodiment of the MCM further includes a second organic substrate situated adjacent the plurality of sockets of the MCM frame, the second organic substrate including interconnects that electrically couple the plurality of chip sub-modules together.

In another embodiment, a method of fabricating a multi-chip module (MCM) is disclosed. The method includes providing a plurality of chip sub-modules, each chip sub-module including a respective integrated circuit (IC) chip situated on a first organic substrate that includes interconnects coupled to the IC chip, each chip sub-module being configured as a separately testable entity. The method also includes situating an MCM frame including a plurality of sockets adjacent the plurality of chip sub-modules, each socket removably receiving a respective chip sub-module of the plurality of chip sub-modules. One embodiment of the disclosed method of fabricating an MCM further includes situating a second organic substrate adjacent the plurality of sockets of the MCM frame, the second organic substrate including interconnects that electrically couple the plurality of chip sub-modules together.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

While an MCM offers significant performance advantages once the MCM is fully fabricated, tested and performance verified, an MCM with multiple bare die attached to an MCM substrate presents a number of significant challenges during device fabrication and assembly. An MCM may require a complex MCM substrate to support interconnections at the C4 (controlled collapsed chip connection) pitch often employed in these high performance multi-chip devices. It is typically necessary to test and burn-in chips prior to assembly of the MCM. This testing and burn-in adds significantly to the cost of each chip used in the MCM. In many cases, the chips are tested on temporary substrates and thus the actual performance of the chip is not explicitly known until after the chips are assembled in the MCM and then tested. Unfortunately, this may result in some incompatibility between the chips in the assembled MCM which may necessitate substantial rework and/or result in suboptimal chip performance.

In one embodiment, the disclosed MCM includes chip sub-modules that are self-contained testable entities. The chip sub-modules plug into respective sockets in a frame of the MCM. Each chip sub-module may be fully tested before being plugged into the MCM. A chip sub-module may include an IC chip, such as a processor, mounted to an sub-module organic substrate that provides electrical interconnects to the chip. The frame into which each chip sub-module plugs sits on a mini-card organic substrate that interconnects the chip sub-modules together. In one embodiment, the disclosed MCM includes a downstop between the mini-card organic substrate and a system board to limit or prevent solder creep of solder connections between the mini-card organic substrate and the system board.

Figure 1:
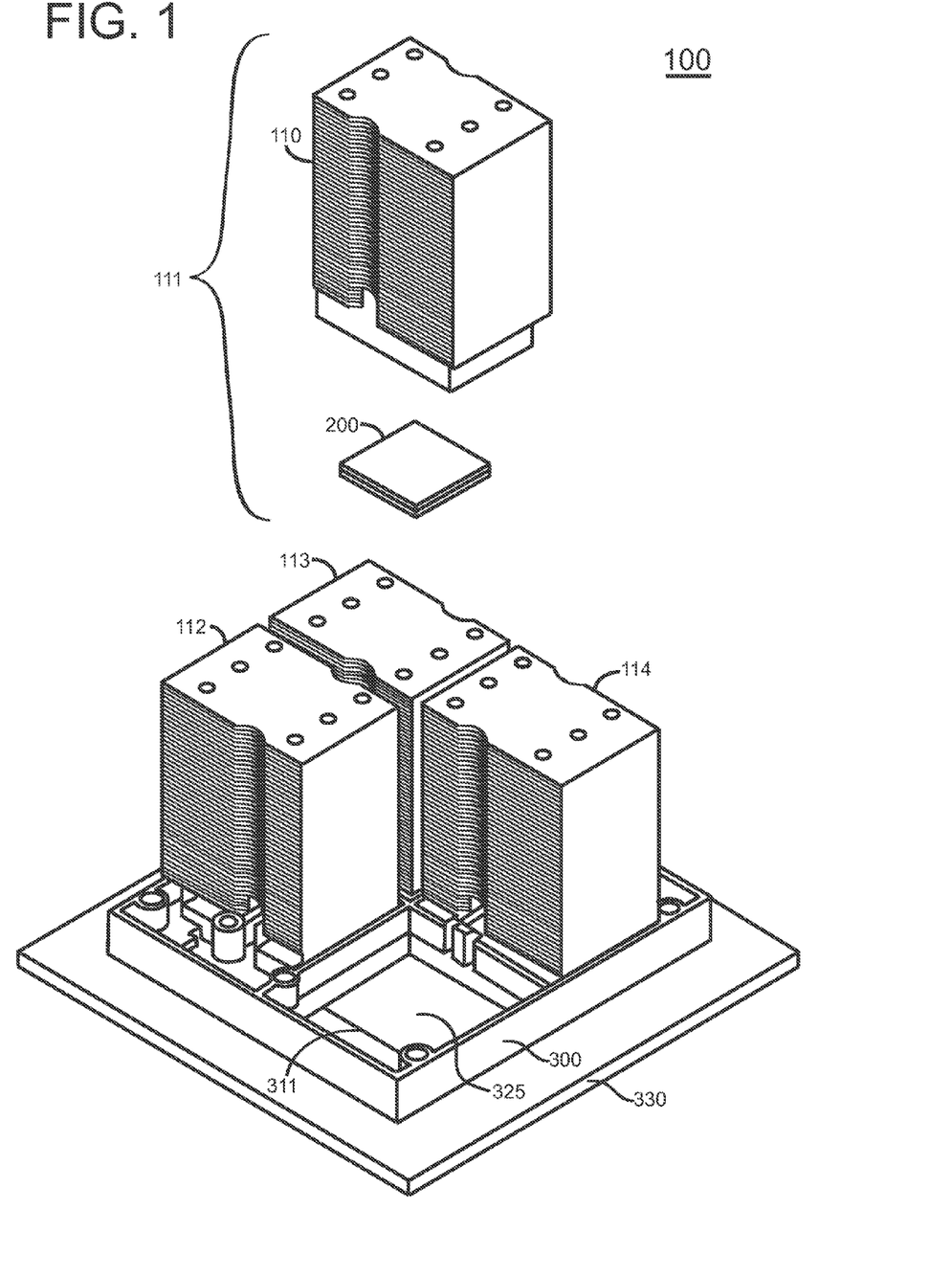
FIG. 1 is an exploded perspective view of one embodiment of the disclosed MCM assembly.

FIG. 1 shows one embodiment of the disclosed MCM 100 that is partially assembled. MCM includes a chip sub-module 200 that mounts to a heat sink 110 to form a chip sub-module/heat sink assembly 111. Chip sub-module/heat sink assembly 111 is a self-contained testable entity. In this particular embodiment, MCM 100 includes chip sub-module/heat sink assemblies 112, 113 and 114 that are fabricated in the same manner as chip sub-module/heat sink assembly 111. Other MCMs may include a different number of chip sub-module/heat sink assemblies than depicted in FIG. 1 depending on the particular application and performance goals. In other embodiments, the chip sub-module itself may be used separately as testable entity.

Chip sub-module/heat sink assembly 111 plugs into a socket 311 in an MCM frame 300. FIG. 1 shows chip sub-module/heat sink assemblies 112, 113 and 114 already plugged into respective sockets in MCM frame 300. A mini-card organic substrate 325 includes interconnects that electrically couple chip sub-module/heat sink assemblies 111, 112, 113 and 114 together, as discussed in more detail below. A portion of mini-card organic substrate 325 is visible in open socket 311. Mini-card organic substrate 325 is situated below chip sub-module/heat sink assemblies 111, 112, 113 and 114, but only the portion of mini-card organic substrate 325 in open socket 311 is visible since assembly 111 is not yet installed in that socket. Mini-card organic substrate 325 interconnects to corresponding connections in a motherboard or system board 330 below mini-card organic substrate 325.

Figure 2:
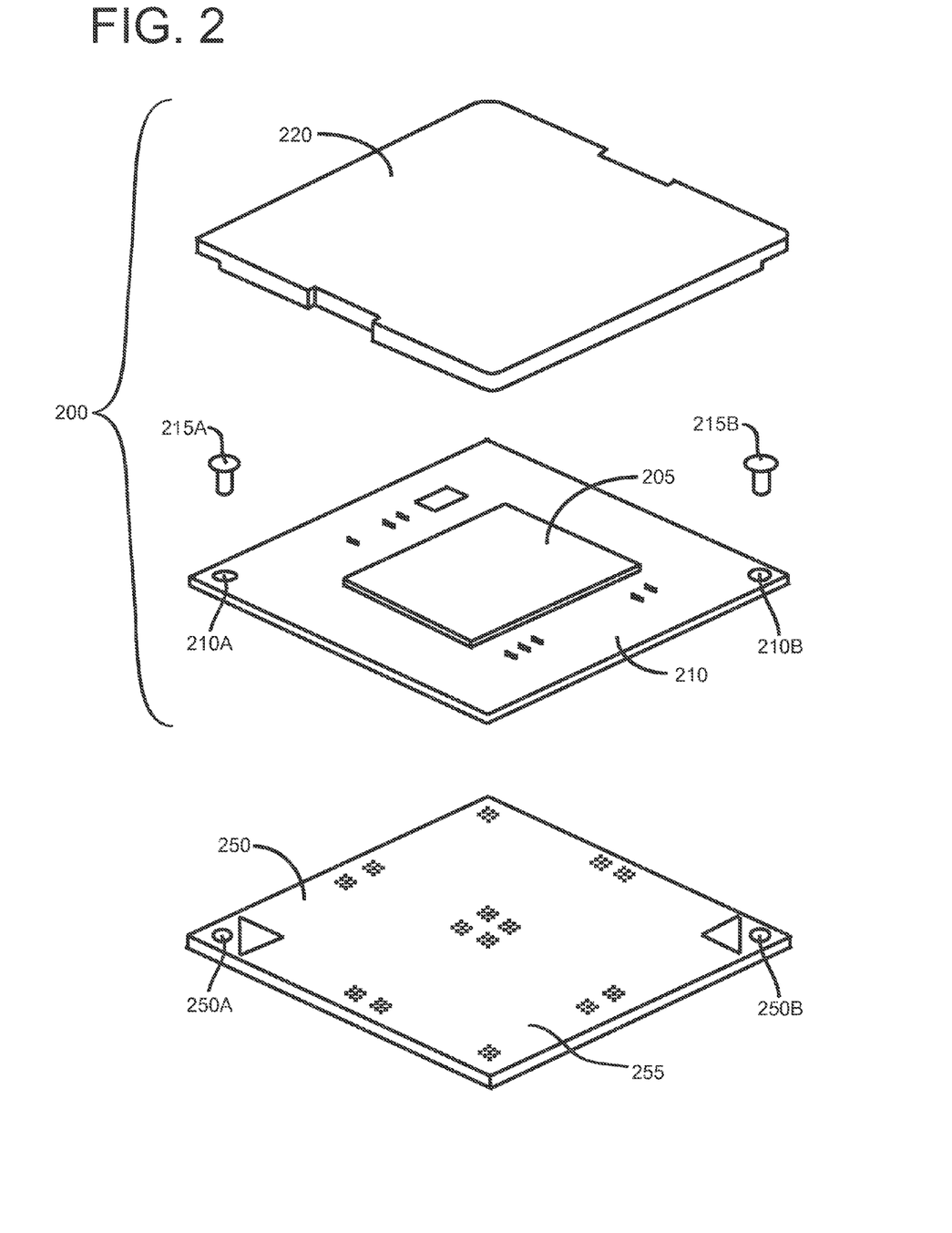
FIG. 2 is a perspective view of a chip sub-module employed in the disclosed MCM assembly.

FIG. 2 shows an exploded perspective view of chip sub-module 200. Chip sub-module 200 includes an integrated circuit (IC) chip 205 such as a processor. Chip 205 is situated on an organic substrate 210, such as a polymer or plastic, for example. Organic substrate 210 may alternatively be referred to as an organic laminate. Organic substrate 210 includes high-density interconnects that connect to the circuits of chip 205. In one embodiment, connections (not shown) on the bottom of organic substrate 210 may exhibit a fine pitch, such as approximately 0.75 mm or less. These connections on the bottom of organic substrate 210 connect chip 205 with other structures of MCM 100. Organic substrate 210 includes alignment holes 210A and 210B that receive respective alignment pins 215A and 215B. A metallic cap or lid 220 is positioned on top of organic substrate 210 and chip 205. In one embodiment, lid 220 is copper metal.

FIG. 2 also shows an interposer 250 below chip sub-module 200. Interposer 250 connects to connections on the lower surface of chip sub-module 200, namely sub-module organic substrate 210. In one embodiment, interposer 250 includes a main body of liquid crystal polymer (LCP) or polyetherimide (PEI) with gold-plated beryllium-copper alloy contacts and interconnects. In actual practice, interposer 250 rests in socket 311 above mini-card organic substrate 325. Interposer 250 includes alignment holes 250A and 250B that receive respective alignment pins 215A and 215B to align sub-module organic substrate 210 with interposer 250 in socket 311. Each socket includes a respective interposer 250 (not visible in FIG. 1) between the chip sub-module 200 in that socket and the mini-card organic substrate 325 below. In this manner, respective interposers 250 provide a connection when they are placed under compression and connect respective chip sub-modules 200 to mini-card organic substrate 325. In turn, mini-card organic substrate 325 connects the sub-modules 200 together via respective connections to the respective interposers of those sub-modules, and further connects the sub-modules 200 to system board 330.

Figure 3:
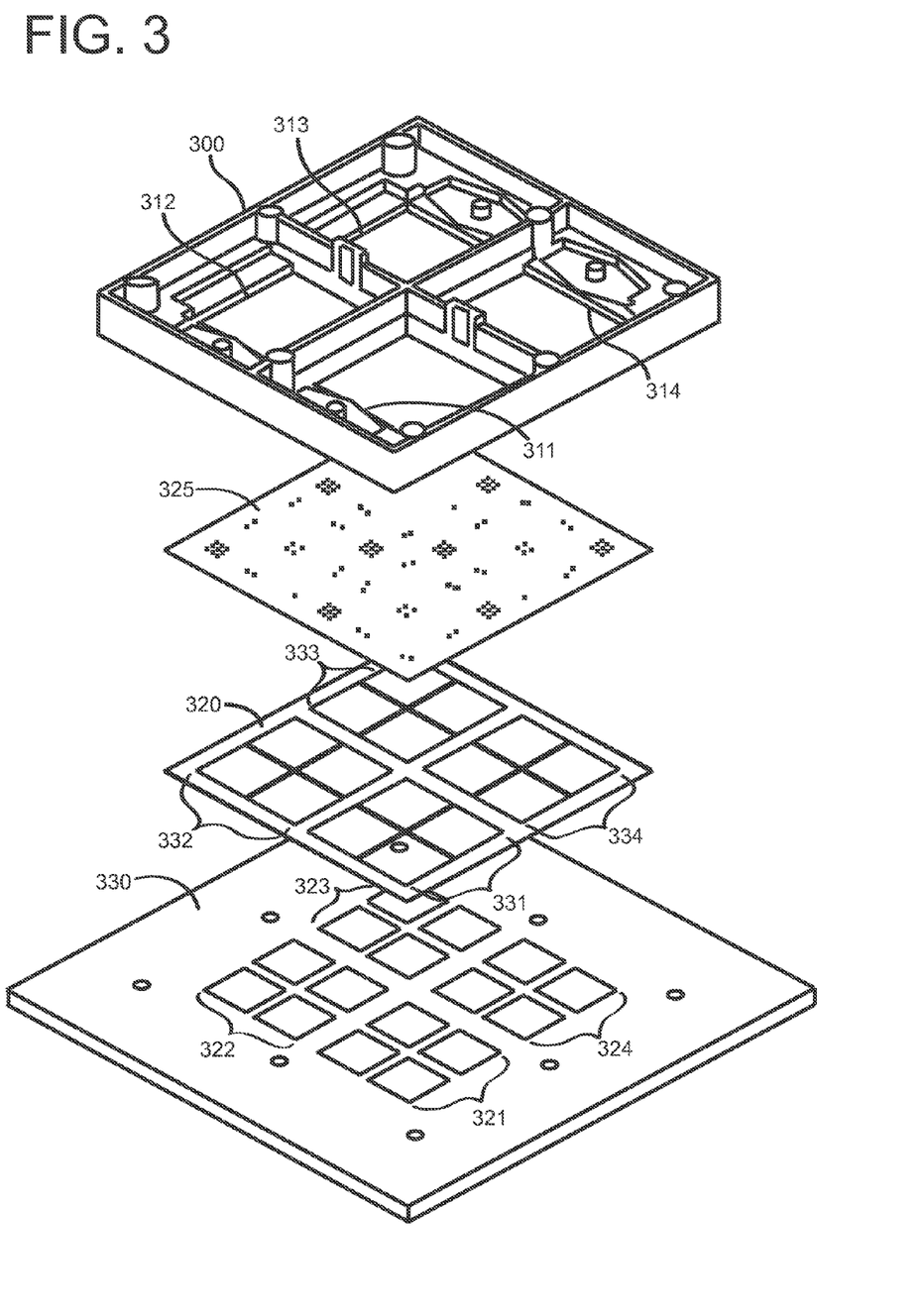
FIG. 3 is an exploded perspective view of a lower portion of one embodiment of the disclosed MCM assembly including a socketed MCM frame.

FIG. 3 is an exploded view showing the stacking sequence of MCM frame 300, mini-card organic substrate 325, a downstop 320 and motherboard or system board 330. MCM frame 300 includes sockets 311, 312, 313 and 314 that respectively receive and mount to chip sub-module/heat sink assemblies 111, 112, 113 and 114. Sockets 311, 312, 313 and 314 each employ a respective interposer 250 (not shown) to make electrical connections to the respective chips of assemblies 111, 112, 113 and 114.

Figure 4:
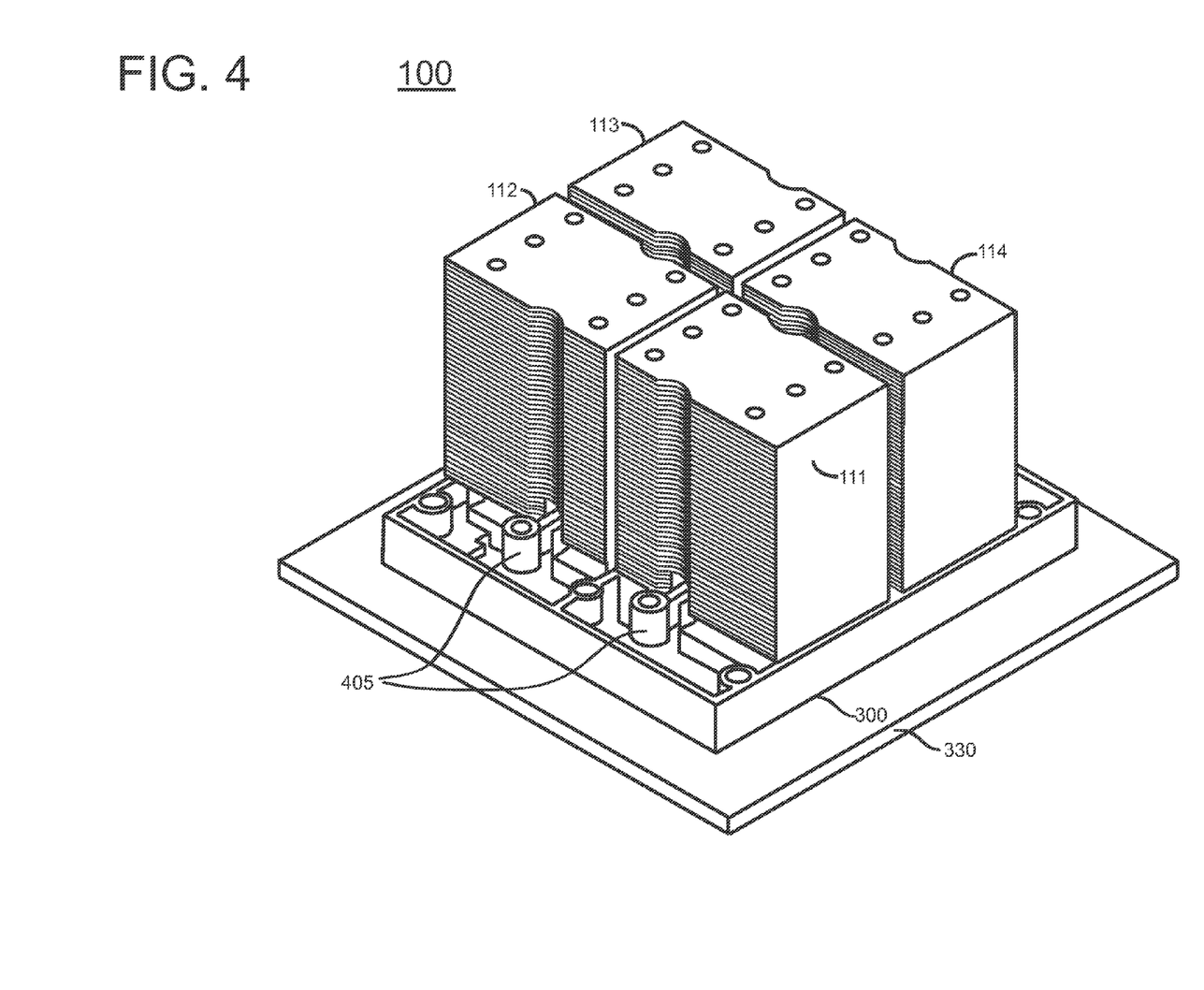
FIG. 4 is a perspective view of a complete MCM in accordance with one embodiment of the disclosed MCM assembly.

In one embodiment, system board 330 includes ball grid array (BGA) pad arrays 321, 322, 323 and 324 that receive solder balls (not shown) to make connections to mini-card organic substrate 325. The solder balls are thus situated between BGA pad arrays 321, 322, 323, 324 and mini-card organic substrate 325 which is above system board 330 in FIG. 3. MCM 100 includes a downstop 320 between the bottom of mini-card organic substrate 325 and the BGA pad arrays 321, 322, 323, 324. Downstop 320 includes respective apertures 331, 332, 333 and 334 above BGA pad arrays 321, 322, 323 and 324 to enable the solder balls to pass through downstop 320 and contact the BGA pad arrays and mini-card organic substrate 325. Referring now to FIG. 3 and FIG. 4, a clamping mechanism 405 locks chip sub-module/heat sink assemblies 111, 112, 113 and 114 in respective sockets 311, 312, 313 and 314, and that further holds mini-card organic substrate 325 in contact with the solder balls on the BGA pad arrays 321, 322, 322 and 324 on system board 300. In one embodiment, clamping mechanism 405 may be a zero-insertion force type clamping mechanism. Returning to FIG. 3, a solder reflow operation completes the connection of the solder balls between the BGA pad arrays 321, 322, 322 and 324 on system board 300 and mini-card organic substrate 325. The downstop 320 is between mini-card organic substrate 325 and system board 330 along with the solder balls in the MCM 100 stack-up. The thickness of downstop 320 is selected such that as the clamping mechanism closes the solder balls are placed under compression, but in operation, the downstop 320 limits the compression and amount of creep that is experienced by the solder balls, thus ensuring the reliability of the soldered connection throughout the life of the MCM product.

In another embodiment, a fabrication process may laminate mini-card organic substrate 325 directly to system board 330. This embodiment may omit downstop 320 because it employs no solder balls and experiences no solder creep. The connections on the bottom of mini-card organic substrate connect directly to respective connections on system board 330 and are held in position by the direct lamination of mini-card organic substrate 325 to system board 330. In this lamination process, a selectively applied conductive adhesive may connect connection pads on the mini-card organic substrate 325 to corresponding connection pads on system board 330. Alternatively, the lamination may employ a transient phase material that melts and forms a connection between the mini-card organic substrate 325 and the system board 330.

The stacking sequence and component count of the components in one embodiment of the disclosed MCM assembly 100 from top to bottom are given by TABLE 1 below:

TABLE 1

| COMPONENT NAME |
| --- |
| heat sink 110 (×4) |
| chip sub-module 200 (×4) |
| cap 220 (×4) |
| chip 205 (×4) |
| sub-module organic substrate 210 (×4) |
| frame 300 (with 4 sockets 311, 312, 313, 314) |
| interposer 250 (×4) |
| mini-card organic substrate 325 |
| downstop 320 |
| system board 330 |

FIG. 4 is a perspective view of a fully assembled MCM 100. MCM includes chip sub-module/heat sink assemblies 111, 112, 113 and 114 installed in MCM frame 300. If testing shows that one chip sub-module assembly is not compatible with another chip sub-module assembly, or if a particular chip sub-module assembly is not working properly, a technician or other user may remove a chip sub-module assembly and easily replace it with another. The easy removability of chip sub-module assemblies from MCM 100 facilitates reworking of those assemblies when an assembly is found to have a problem.

Figure 5:
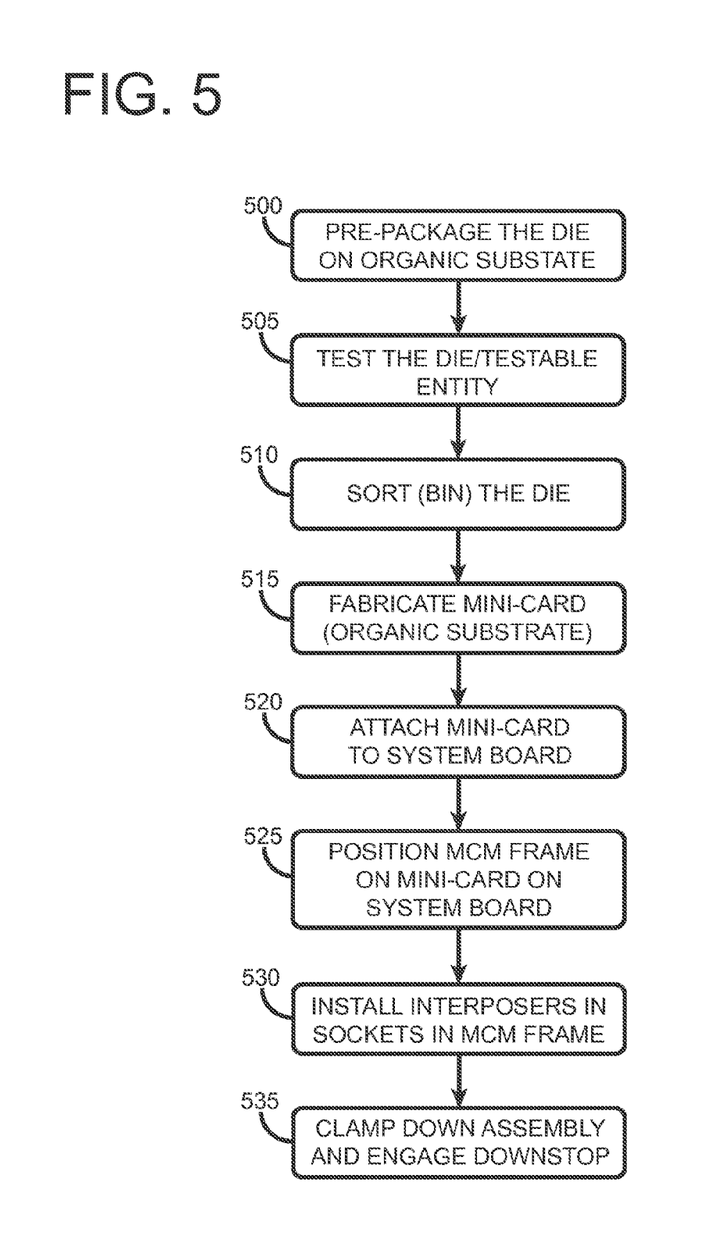
FIG. 5 is a flowchart that shows process flow during fabrication of the disclosed MCM assembly.

FIG. 5 is a flowchart that describes the process of fabricating one embodiment of the disclosed MCM 100. The process commences with pre-packaging a die or chip 205 on an organic substrate 210 to form a separately testable entity, as per block 500. In another embodiment, the testable entity includes a heat sink 110 as well as chip 205 and organic substrate 210. An operator or automated equipment tests the testable entity, as per block 505, and sorts or bins the testable entities according to their measured performance characteristics, as per block 510. The process then fabricates a mini-card organic substrate 325 that includes interconnects to couple the chip sub-module assemblies or testable entities together, as per block 515. The process attaches mini-card organic substrate 325 to system board 330, as per block 520. As discussed above, downstop 320 in combination with solder balls provides one way to attach the interconnects of mini-card organic substrate 325 to the interconnects of system board 330. Alternatively, direct lamination is another way to attach the interconnects of mini-card organic substrate 325 to the interconnects of system board 330.

The disclosed process positions MCM frame 300 atop mini-card organic substrate 325, as per block 525. The process installs a respective interposer 250 in each of the sockets 311, 312, 313 and 314 of MCM frame 300, as per block 530. A clamping mechanism in MCM frame 300 engages and holds the chip sub-module assemblies, mini-card organic substrate 325, interposers 250, downstop 320 and system board 330 together. The disclosed MCM may provide higher density connections than single chip modules (SCMs) can support. The disclosed MCM may concentrate modules for more efficient thermal dissipation with cold plates or other heat sinking arrangements. In an alternative embodiment, one of chip sub-module/heat sink assemblies 111, 112, 113 and 114 is usable as a fully tested component outside of an MCM by attaching the assembly to a suitable motherboard or system board.

The disclosed MCM 100 employs multiple organic substrates that are substantially less expensive than traditional ceramic substrates. The chip sub-module assemblies 111, 112, 113 and 114 are testable entities that are readily removable from MCM 100 for rework should that be necessary. MCMs employing organic substrates may sometimes require rework. Thus, the easy removability of chip sub-module assemblies 111, 112, 113 and 114 is significant. Chip sub-module assemblies 111, 112, 113 and 114 are much less expensive that a traditional MCM. Because of their lower cost, it is substantially easier to maintain inventories of replacement chip sub-module assemblies than complete MCMs should replacement or rework ever be necessary. Downstop 320 provides a mechanism for limiting or preventing solder creep in the fully assembled MCM 100.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A multi-chip module (MCM), comprising:
    a plurality of chip sub-modules, each chip sub-module including a respective processor integrated circuit (IC) chip situated on a first organic substrate that includes interconnects coupled to the respective processor IC chip, each chip sub-module being configured as a separately testable entity;
    an MCM frame including a plurality of chip sub-module receiving sockets, each chip sub-module receiving socket removably receiving a respective chip sub-module of the plurality of chip sub-modules; and
    a second organic substrate situated adjacent the plurality of chip sub-module receiving sockets of the MCM frame, the second organic substrate including interconnects that electrically couple the plurality of chip sub-modules together;
    each chip sub-module receiving socket including a respective interposer that couples the respective chip sub-modules to the second organic substrate.

2. The MCM of claim 1, further comprising a system board including ball grid arrays that couple via solder balls to the interconnects of the second organic substrate.

3. The MCM of claim 2, further comprising a downstop situated between the second organic substrate and the system board to limit compression of the solder balls.

4. The MCM of claim 3, further comprising a clamping mechanism that holds the chip sub-modules, the second organic substrate, the downstop and the system board together.

5. The MCM of claim 3, wherein the downstop includes a plurality of openings in which the solder balls are situated.

6. The MCM of claim 1, further comprising a respective heat sink attached to each chip sub-module of the plurality of chip sub-modules.

7. The MCM of claim 1, wherein the chip sub-modules each include a respective metallic cap situated adjacent the processor IC chip of each chip sub-module.

8. The MCM of claim 1, wherein each of the chip sub-modules and each of the interposers include alignment pins to align each chip sub-module with a respective interposer.

9. A method of fabricating a multi-chip module (MCM), comprising:
    providing a plurality of chip sub-modules, each chip sub-module including a respective processor integrated circuit (IC) chip situated on a first organic substrate that includes interconnects coupled to the respective processor IC chip, each chip sub-module being configured as a separately testable entity;
    situating an MCM frame including a plurality of chip sub-module receiving sockets adjacent the plurality of chip sub-modules, each chip sub-module receiving socket removably receiving a respective chip sub-module of the plurality of chip sub-modules; and
    situating a second organic substrate adjacent the plurality of chip sub-module receiving sockets of the MCM frame, the second organic substrate including interconnects that electrically couple the plurality of chip sub-modules together, wherein each chip sub-module receiving socket includes a respective interposer that couples the respective chip sub-modules to the second organic substrate.

10. The method of claim 9, further comprising coupling, by a system board, to the interconnects of the second organic substrate, the system board including ball grid arrays that couple via solder balls to the interconnects of the second organic substrate.

11. The method of claim 10, further comprising situating a downstop between the second organic substrate and the system board to limit compression of the solder balls.

12. The method of claim 11, further comprising engaging a clamping mechanism to hold the chip sub-modules, the second organic substrate, the downstop and the system board together.

13. The method of claim 11, further comprising providing the downstop with a plurality of openings in which the solder balls are situated.

14. The method of claim 9, further comprising attaching a respective heat sink to each chip sub-module of the plurality of chip sub-modules.

15. The method of claim 9, further comprising providing each of the chip sub-modules with a respective metallic cap situated adjacent the processor IC chip of each chip sub-module.

16. The method of claim 11, further comprising providing each of the chip sub-modules and each of the interposers with alignment pins to align each chip sub-module with a respective interposer.

* * * * *